United States Patent
Sato

(10) Patent No.: US 6,287,895 B1
(45) Date of Patent: Sep. 11, 2001

(54) SEMICONDUCTOR PACKAGE HAVING ENHANCED BALL GRID ARRAY PROTECTIVE DUMMY MEMBERS

(75) Inventor: Akira Sato, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/493,198

(22) Filed: Jan. 28, 2000

(30) Foreign Application Priority Data

Jan. 29, 1999 (JP) .................................................. 11-021030

(51) Int. Cl.[7] .......................... H01L 21/44; H01L 21/48; H01L 21/50
(52) U.S. Cl. .......................... 438/114; 438/612; 438/106; 438/108
(58) Field of Search .................................. 438/612, 106, 438/114, 117, 108

(56) References Cited

U.S. PATENT DOCUMENTS

| 5,863,814 | * | 1/1999 | Alcoe et al. | 438/117 |
| 5,941,449 | * | 8/1999 | Le Coz et al. | 228/248.1 |
| 6,024,579 | * | 2/2000 | Bennett | 439/67 |
| 6,074,896 | * | 6/2000 | Dando | 438/114 |

FOREIGN PATENT DOCUMENTS

| 8-111470 | 4/1996 | (JP) . |
| 11-8330 | 1/1999 | (JP) . |

OTHER PUBLICATIONS

Japanese Office Action dated Sep. 26, 2000 with Partial English translation.

* cited by examiner

Primary Examiner—Vu A. Le
Assistant Examiner—Adam Pyonin
(74) Attorney, Agent, or Firm—McGinn & Gibb, PLLC

(57) ABSTRACT

A semiconductor package having: a chip-sized wiring board that has a predetermined wiring pattern; a semiconductor chip that is mounted on the wiring board and is electrically connected to the wiring pattern; sealing resin that seals at least the connection part of the wiring board and the semiconductor chip; an array of solder balls for external circuit connection that are connected through an opening in the sealing resin to a land of the wiring pattern; and
  a protective member that is disposed along at least two sides of the surface where the array of solder balls are provided.

14 Claims, 8 Drawing Sheets

SEMICONDUCTOR PACKAGE HAVING ENHANCED BALL GRID ARRAY PROTECTIVE DUMMY MEMBERS

FIELD OF THE INVENTION

This invention relates to a semiconductor package, and more particularly to, a semiconductor package that is connected with a printed wiring board using a ball grid array (BGA).

BACKGROUND OF THE INVENTION

In the case that a chip size package (CSP) as a semiconductor package is mounted on a printed wiring board and the package main body is connected with the printed wiring board only through solder balls, if a stress in the vertical direction is applied to the ends of the chip size package, then a solder connection opposed to part to which the stress is applied is broken. To avoid this breaking, conventionally used is a method that dummy members as a spacer are disposed at the ends of the package, thereby keeping the spacing between the package main body and the printed wiring board constant, thus protecting the solder connection parts of the ball grid array.

FIGS. 1A and 1B are a front view and top view, respectively, showing the shape of chip size package after mounting the solder balls and dummy member by the conventional method for making semiconductor package. Here, shown is a chip size package that is provided with one semiconductor chip (not shown) diced from a semiconductor wafer. There are provided protective dummy members 2 (protective parts) that are of round resinous or metallic material with a predetermined height at the corners on the surface of a package main-body board 1 that has a size nearly equal to that of the semiconductor chip. On a region 4 except these parts, there are mounted multiple solder balls 3, which compose a ball grid array (BGA), at predetermined intervals. The protective dummy member 2 is a protrusion provided to protect the ball grid array during fabrication of the package. The diameter of the protective dummy members 2 is set to be larger than that of the solder balls 3, and the solder balls 3 are disposed avoiding the regions of the protective dummy members 2. Therefore, array area 4 as the mounting region of the solder balls 3 is approximately hexagonal.

FIG. 2 is a flow chart showing the conventional method for making a semiconductor package. First, the package main-body board 1 is prepared (step 201). Then, a semiconductor chip (not shown) diced from a semiconductor wafer is mounted on the package main-body board 1 (step 202). Then, after wire-bonding lands on the semiconductor chip to a wiring pattern (or lands) on the package main-body board 1 (step 203), the surface subject to the bonding is sealed with resin mold (step 204). Further, as shown in FIG. 1A, the solder balls 3 are mounted on corresponding lands on the surface of the package main-body board 1 that is not subject to the resin molding. Then, the protective dummy members 2 are mounted using a mold tool.

As described above, in the conventional method, the molding and sealing, the mounting of solder balls, and the mounting of protective dummy members are conducted individually to each semiconductor chip.

Thus, in the conventional method for making a semiconductor package, there is a problem that the process is difficult to simplify since the molding and sealing, the mounting of solder balls, and the mounting of protective dummy members are conducted individually to each package main-body board. Therefore, it is difficult to reduce the manufacturing cost by the mass production.

Also, the protective dummy members are difficult to position at the ends of package with a high degree of accuracy. They have to be positioned a given distance ($\alpha$ in FIG. 1B), as a margin, apart from the ends of package. Therefore, when a stress in the vertical direction is applied to the ends of package after fabrication, it will exhibit a lowered tolerance.

In recent years, the lump transfer method that a large number of semiconductor chips can be molded in the lump has attracted attention. However, in a semiconductor device that has the structure of chip size package or ball grid array, it is difficult to attach the dummy members efficiently. Therefore, it becomes an obstacle to the practical use of the lump transfer method.

SUMMARY OF THE INVENTION

Accordingly, it is an object of the invention to provide a method for making a semiconductor package that the protective dummy members can be disposed precisely and efficiently.

It is a further object of the invention to provide a semiconductor package that a tolerance against a stress in the vertical direction applied to the ends of package after fabrication can be enhanced.

According to the invention, a semiconductor package, comprises:

a chip-sized wiring board that has a predetermined wiring pattern;

a semiconductor chip that is mounted on the wiring board and is electrically connected to the wiring pattern;

sealing resin that seals at least the connection part of the wiring board and the semiconductor chip;

an array of solder balls for external circuit connection that are connected through an opening in the sealing resin to a land of the wiring pattern; and a protective member that is disposed along at least two sides of the surface where the array of solder balls are provided.

In this composition, the protective members with a predetermined length are disposed along at least two sides of the surface where the array of solder balls are provided. The protective members function as a guide to maintain uniform the offset spacing between the wiring board and the package main-body board when mounting the wiring board on the package main-body board through the solder balls. Therefore, in the re-flowing the solder balls, the spacing between the wiring board and the package main-body board can be uniform at every point even when there occurs a deviation in melting among the solder balls. Thus, the cost reduction, and the mass production of semiconductor package can be advanced. Furthermore, the mounting space of solder balls can be enlarged.

According to another aspect of the invention, a method for making a semiconductor package, comprising the steps of:

mounting a plurality of semiconductor chips on a board with a predetermined dimensions that has a plurality of common wiring patterns;

electrically connecting the semiconductor chips and the corresponding wiring patterns of the board;

resin-sealing the surface of the board that incurs the electrical connection;

mounting a plurality of solder balls on the surface of the board that no semiconductor chip is mounted to form a ball grid array;

mounting a protective member with a predetermined length for protecting the ball grid array on a dicing line at both sides of the ball grid array; and dicing the board along the dicing line to divide the protective member nearly equally in the direction of the dicing line.

In this method, a plurality of semiconductor chips are disposed on one package main-body board, then mounting the solder balls and protective members in the lump on to the plurality of semiconductor chips, then dicing it to divide into a plurality of chip size packages. Thus, the simplification of fabrication process for chip size package, the cost reduction and the mass production of chip size package can be advanced.

According to another aspect of the invention, a method for making a semiconductor package, comprises the steps of:

forming ball grid arrays of solder balls on a plurality of semiconductor chips fabricated on a semiconductor wafer after sealing with resin;

mounting a protective member with a predetermined length for protecting the ball grid arrays to locate on the borderline to section two of the ball grid arrays and on both sides of two of the ball grid arrays; and dicing the semiconductor wafer to divide the protective member nearly equally in the direction of a dicing line.

In this method, at the stage of a semiconductor wafer, the solder balls and dummy members for each of multiple semiconductor devices are mounted, then dicing it to divide into devices. Thus, the simplification of fabrication process for semiconductor device, the coat reduction and the mass production of semiconductor device can be advanced.

BRIEF DESCRIPTION OF THE DRAWINGS

The invention will be explained in more detail in conjunction with the appended drawings, wherein.

DESCRIPTION OF THE PREFERRED EMBODIMENTS

Figure 1A:
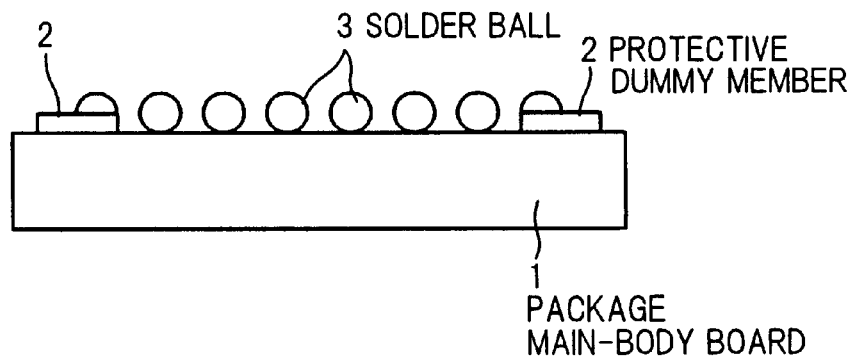
FIG. 1A is a front view showing a chip size package that solder balls and dummy members are mounted by the conventional method for making a semiconductor package.
Figure 1B:
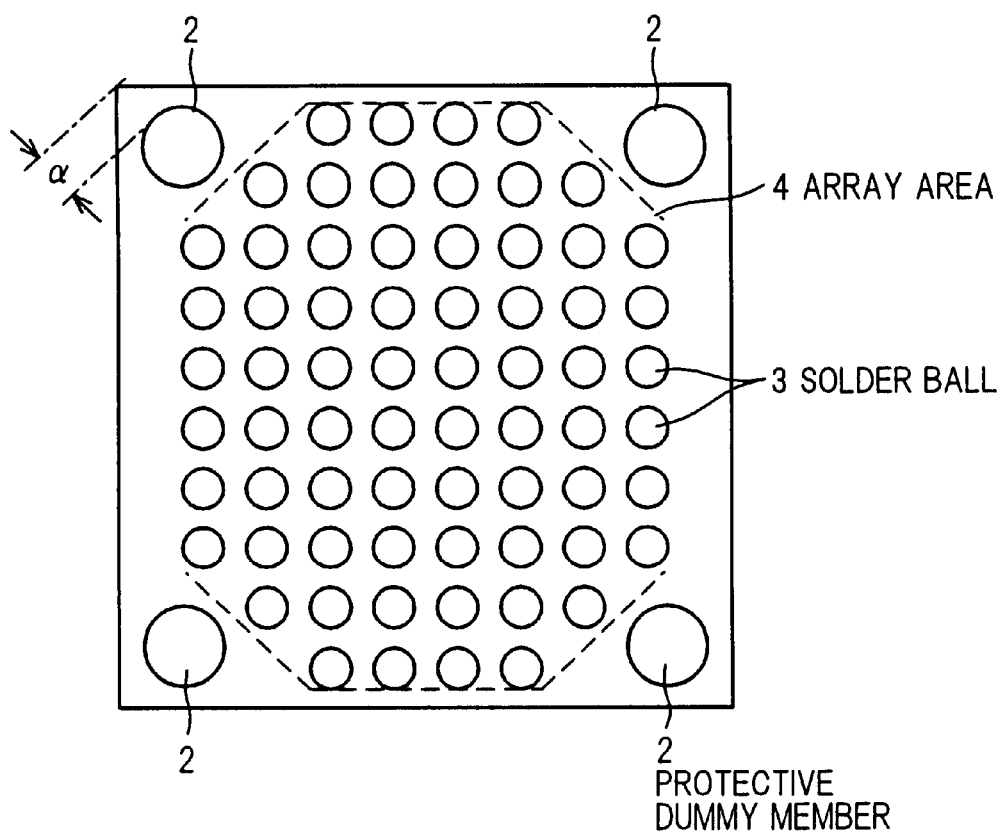
FIG. 1B is a top view showing the chip size package in FIG. 1A.
Figure 2:
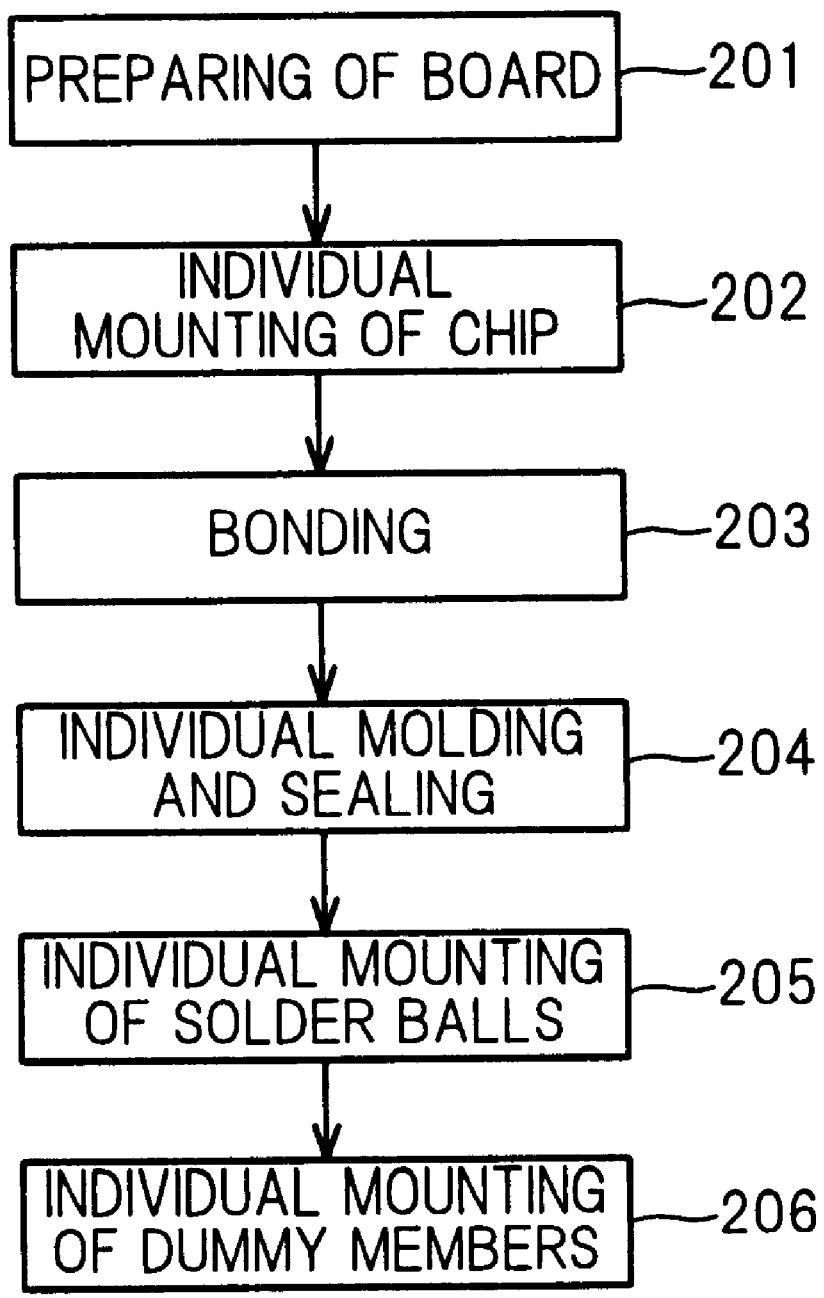
FIG. 2 is a flow chart showing the conventional method for making a semiconductor package.

The preferred embodiments of the invention will be explained below referring to the drawings.

First Embodiment

Figure 3A:
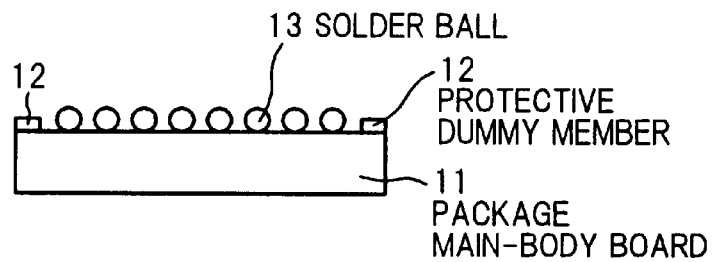
FIG. 3A is a front view showing a chip size package that solder balls and dummy members are mounted by a method for making a semiconductor package according to the invention.
Figure 3B:
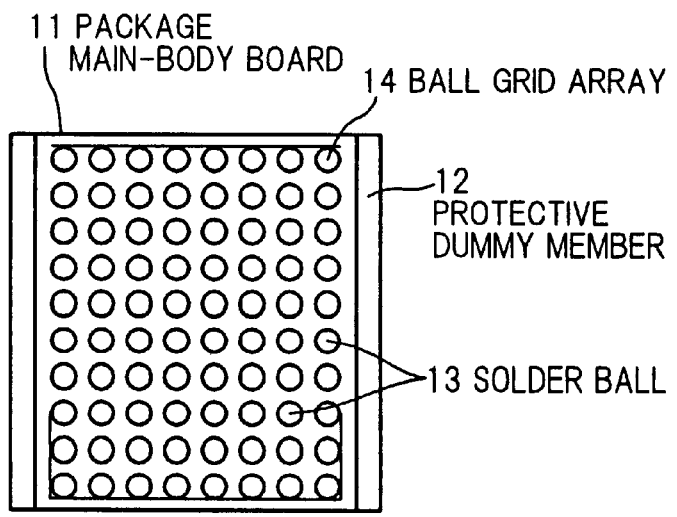
FIG. 3B is a top view showing the chip size package in FIG. 3A.
Figure 3C:
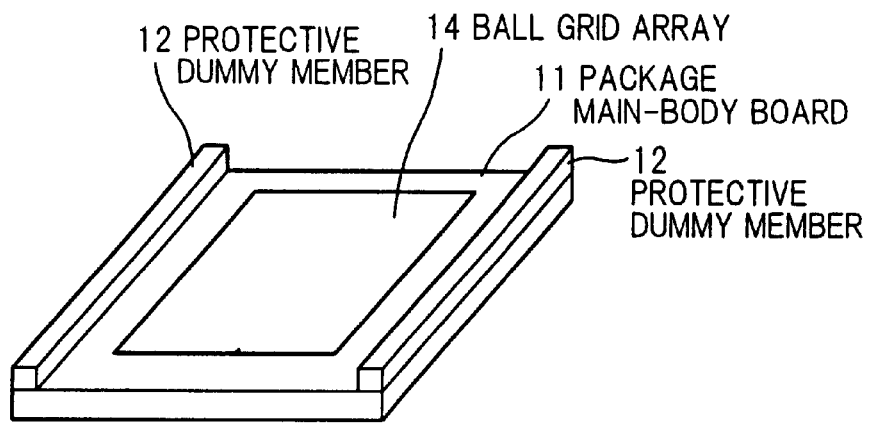
FIG. 3C is a perspective view showing the chip size package in FIG. 3A.

FIGS. 3A to 3C show the exterior of a semiconductor chip on which solder balls and protective dummy members are mounted by a method for making a semiconductor package in the first preferred embodiment according to the invention. FIG. 3A is a front view, FIG. 3B is a top view and FIG. 3C is a perspective view (solder balls are not shown). Also, in these figures, a semiconductor chip is not shown.

In this embodiment, a package main-body board 11 is made of epoxy resin, and a wiring pattern of conductive resin or metal film is formed on the package main-body board 11. Also, the package main-body board 11 has such a size that multiple semiconductor chips and solder balls for these semiconductor chips can be mounted in the lump. Namely, it has a size that a plurality of the prior package main-body boards 1 are aligned. On the land-forming surface of the package main-body board 11, protective dummy members 12 are adhered along the borderline between neighboring semiconductor chips. As the protective dummy members 12, a strip of heat-resisting plastic film is used. Between the protective dummy members 12, the solder balls 13 are mounted at given pitches. Since an array area 14 in which the solder balls 13 are mounted is formed quadrangular, the solder balls 13 are laid out efficiently.

Figure 4:
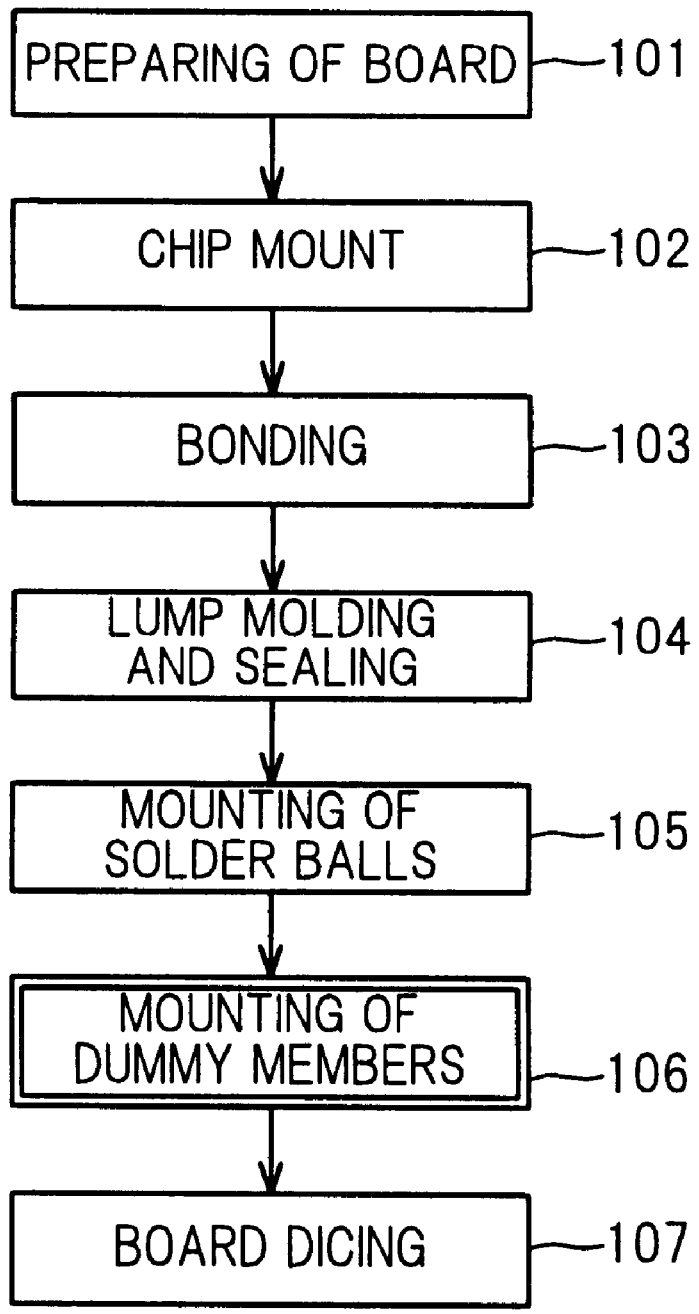
FIG. 4 is a flow chart showing the method for making a semiconductor package according to the invention.

FIG. 4 shows the method for making a semiconductor package according to the invention. As described above, according to the invention, the package main-body board 11 has such a size that a plurality of semiconductor chips can be mounted simultaneously. After making the package main-body board 11 (step 101), a plurality of semiconductor chips are mounted on the package main-body board 11 in the same step (step 102). Then, lands on each semiconductor chip are wire-bonded to a wiring pattern (or lands) on the package main-body board 11 (step 103). Further, the lump transfer molding and sealing is conducted so that all semiconductor chips mounted on the package main-body board 11 are covered with resin mold (step 104). After the sealing, to the mounting surface of the package main-body board 11, the protective dummy members 12 with a height sufficient to protect the solder balls after mounting are attached at parts that correspond to the ends of each chip size package and correspond to parts to be diced.

Here, the solder balls 13 are mounted (step 105) in the lump on each land on the surface that is not resin-molded of each semiconductor chip. Then, as shown in FIGS. 3A to 3C, the protective dummy members 12 are mounted. After that, the package main-body board 11 is diced using a dicing saw along the centerline of the protective dummy members 12, separated into respective semiconductor chips (step 107). As described above, in this embodiment, a plurality of semiconductor chips are mounted in the lump on the one large board, and the respective processes of resin molding and sealing, mounting of the solder balls 13, and mounting of the protective dummy members 12 are conducted in the lump for the plurality of semiconductor chips. Especially, concerning the protective dummy members 12, it is equal to that they are attached to multiple sheets of the package main-body boards 11 by only one attachment. Therefore, the mounting efficiency of the protective dummy members 12 can be enhanced significantly. Also, the protective dummy members 12 are left being self-aligned at the ends of chip size package by dicing. Therefore, to protect the solder balls from a stress applied to the ends of the chip size package in the vertical direction can be enhanced.

Further, in the protective dummy members 12, the distance between the end of package can be made to be zero, compared with, e.g. ball-shaped dummy members attached to each package main-body board 11 maintaining a dimension α. Therefore, as shown in FIGS. 3A to 3C, the restriction in the BGA region becomes less than that in prior art. Also, since it is not necessary to mount the protective dummy members 12 on each package after dicing, the fabrication process can be simplified. Thus, in this embodiment, the simplification of fabrication process for chip size package, the cost reduction and the mass production of chip size package can be advanced.

Figure 5:
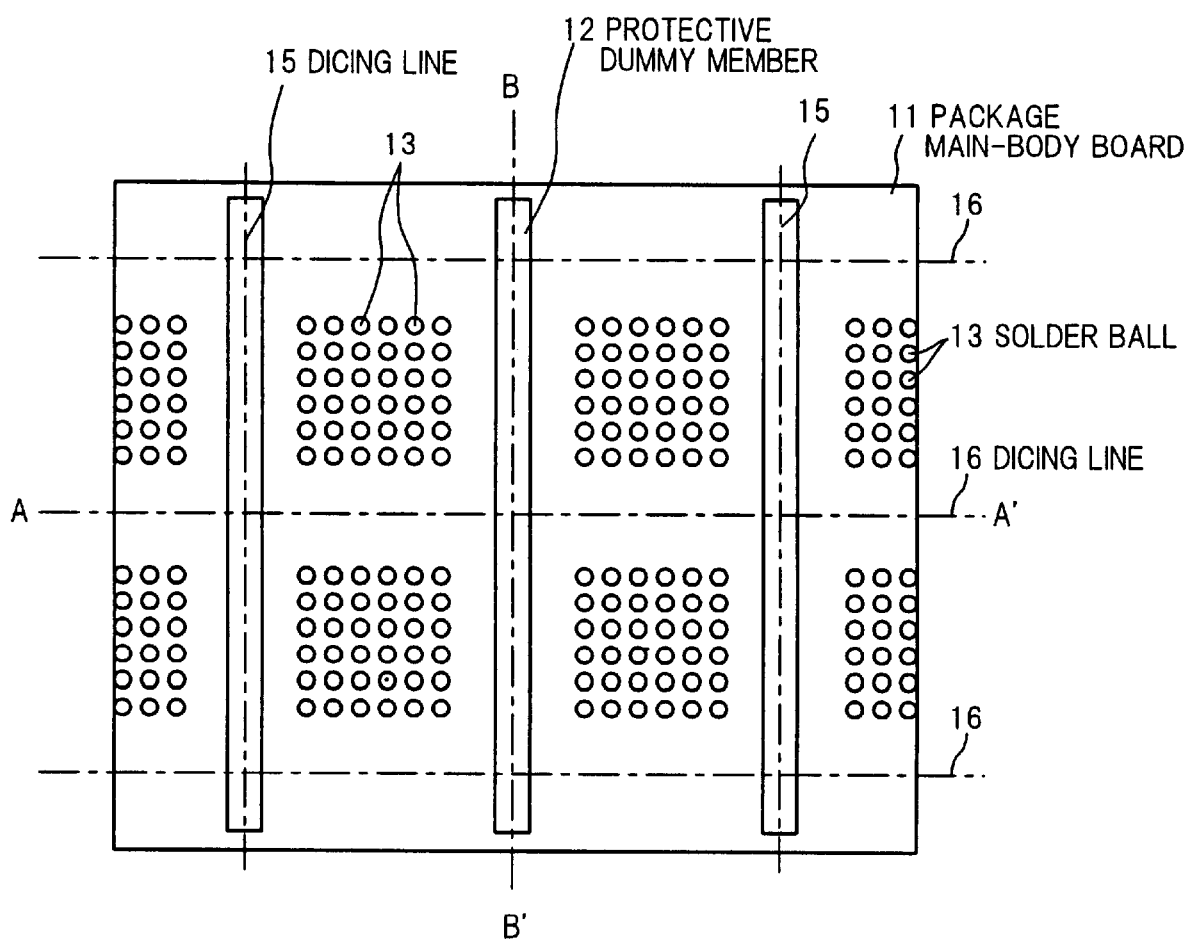
FIG. 5 is a top view showing the protective dummy members mounted by the method shown in FIG. 4.
Figure 6A:
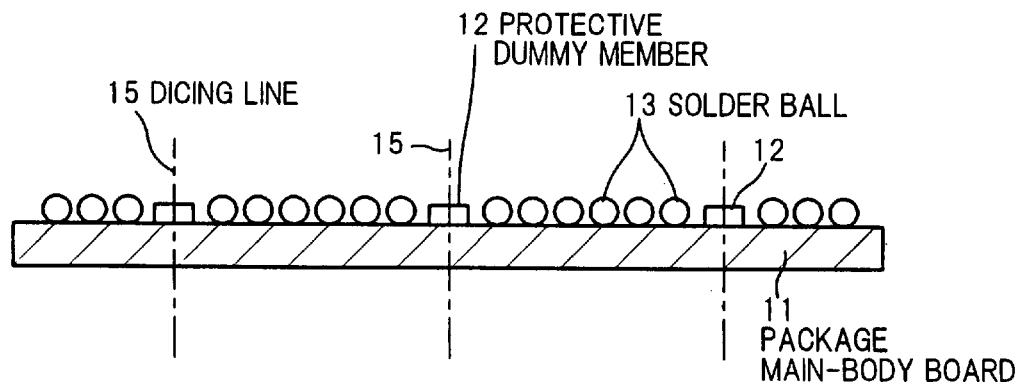
FIG. 6A is a cross sectional view cut along the line A–A' in FIG. 5.
Figure 6B:
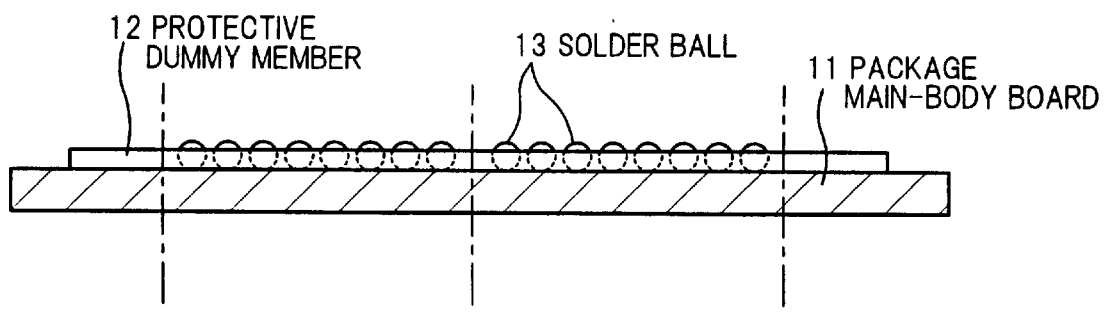
FIG. 6B is a cross sectional view cut along the line B–B' in FIG. 5.

FIG. 5 shows a state that the attachment of the protective dummy members 12 is completed at step 106 in FIG. 4. Also, FIGS. 6A and 6B are sectional views cut along the lines A–A' and B–B', respectively in FIG. 5. At the boundary of the mounting region (array area) of the solder balls 13, the protective dummy members 12 are attached. The center of the protective dummy member 12 corresponds to a dicing line 15 in the vertical direction in FIG. 5. Also, at the horizontal boundary of the mounting region of the solder balls 13, a dicing line 16 is set. At step 107 in FIG. 4, the board is diced along the dicing lines 15 and 16, formed into the chip size packages.

As shown in FIG. 6A, in A–A' section of the package main-body board 11, the protective dummy member 12 is disposed astride two adjacent chip size packages. The package main-body board 11 is cut off along the dicing lines 15 (boundary of package) on the protective dummy member 12, which correspond to the end of package. Also, in B–B' section of the package main-body board 11, the dicing lines 16 are provided. Along these lines, the package main-body board 11 is cut off. The protective dummy members 12, which require a height efficient to protect the solder balls, are set to have a thickness slightly less than the diameter of the solder balls 13 mounted.

Figure 7:
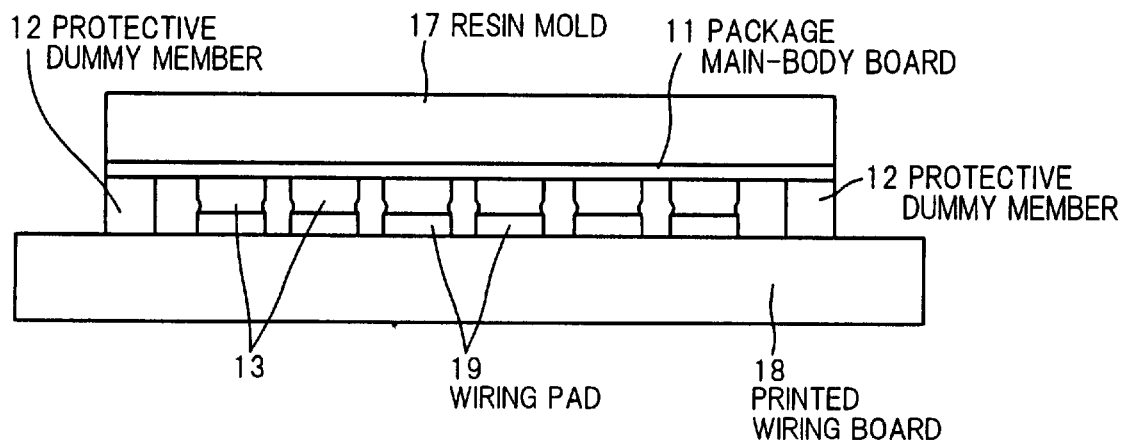
FIG. 7 is a front view showing the chip size package in FIG. 3A mounted on a printed wiring board.

FIG. 7 shows the state that the chip size package in FIG. 3A fabricated by the process in FIG. 4 is mounted on a printed wiring board 18 as an external circuit. The chip size package is provided with resin mold 17, which is given at step 104 in FIG. 4, on the backside (not provided with the solder balls) of the package main-body board 11 in FIG. 3A. The printed wiring board 18 to mount the chip size package having such a structure is provided with wiring pads 19 that are disposed aligned to the positions of the solder balls 13. Aligning the wiring pads 19 to the solder balls 13, the chip size package is mounted on the printed wiring board 18.

When the chip size package is mounted on the printed wiring board 18, paste solder is coated only on the wiring pads 19 of the printed wiring board 18 using a mask, then moving them into a flow furnace at a high-temperature atmosphere while contacting the wiring pads 19 with the printed wiring board 18, thereby solder is fused together at the contacting parts. Thus, the electrodes on the printed wiring board 18 side are electrically connected to the electrodes on the package side. As a result, the distance between the printed wiring board 18 and chip size package becomes short as shown in FIG. 7, but the final distance is determined by the height of the protective dummy members 12. The protective dummy members 12 function as a support between the printed wiring board 18 and the chip size package, protecting the solder balls 13.

As described above, in the first embodiment of the invention, as shown in FIG. 4, a plurality of semiconductor chips are mounted in the lump on the one large board, and the respective processes of resin molding and sealing, mounting of the solder balls, the mounting of the protective dummy members are conducted in the lump for the plurality of semiconductor chips. Therefore, the mounting of the protective dummy members can be conducted efficiently. Thus, the simplification of fabrication process for chip size package, the cost reduction and the mass production of chip size package can be advanced.

Second Embodiment

Figure 8:
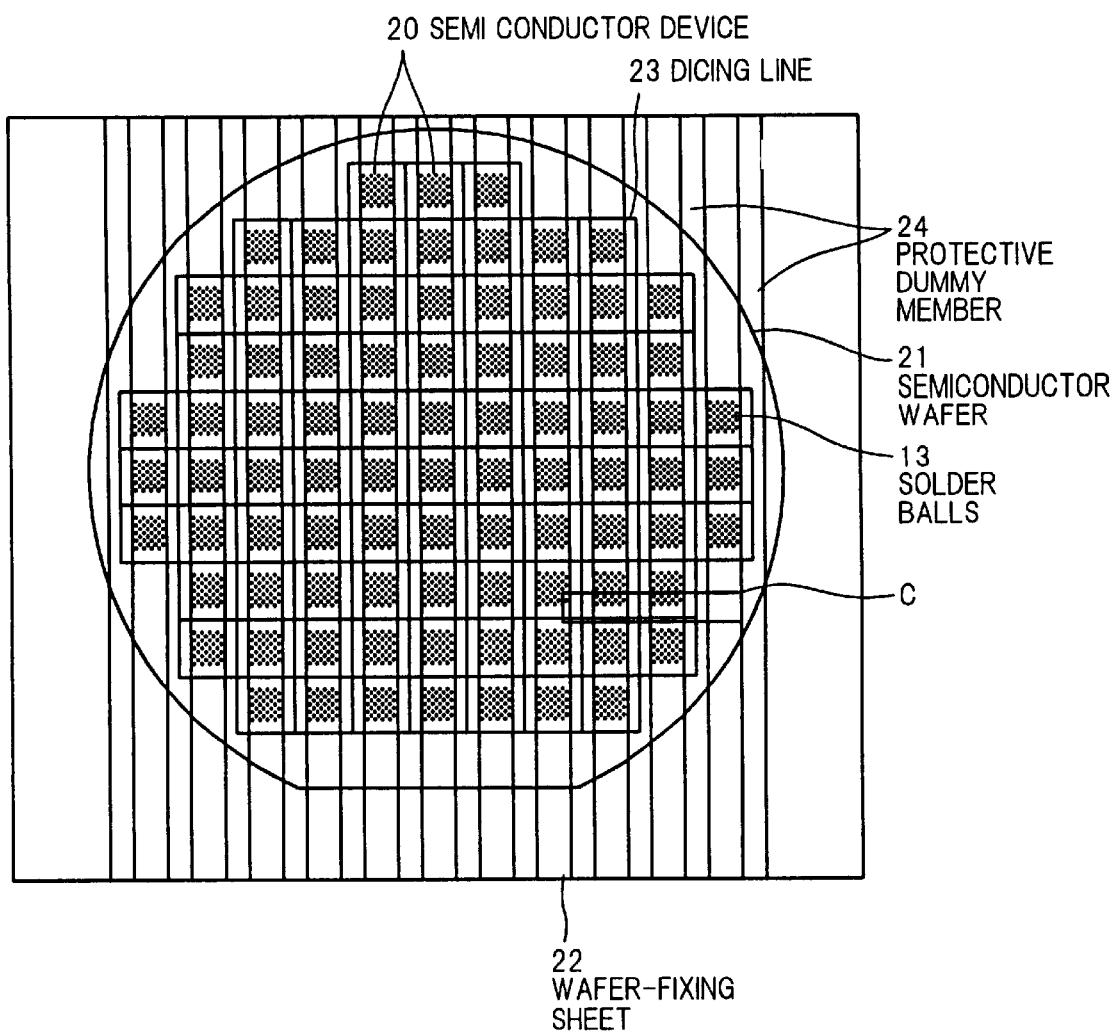
FIG. 8 is a top view showing another method for making a semiconductor package according to the invention.

FIG. 8 shows a method for making a semiconductor package in the second preferred embodiment according to the invention. Also FIG. 9 is an enlarged cross sectional view at part C in FIG. 8.

This embodiment is characterized in that, at the stage of a semiconductor wafer, solder balls and dummy members for a plurality of chip size packages are mounted. A semiconductor wafer 21 with multiple semiconductor devices 20 fabricated is held and fixed by a wafer-fixing sheet 22. Multiple solder balls 13 are mounted at given intervals on each of the semiconductor devices.

Figure 9:
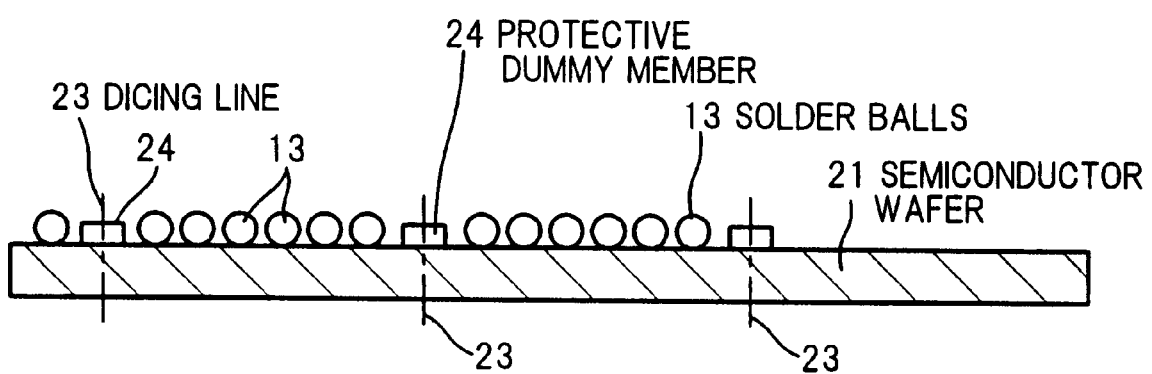
FIG. 9 is an enlarged cross sectional view showing part C in FIG. 8.

As shown in FIG. 9, on dicing lines 23 that are set on the boundaries to section into ball grid arrays, protective dummy members 24 as a protective member are mounted. As the protective dummy members 24, a strip of heat-resisting plastic film is used. Like the protective dummy members 12 described earlier, their thickness is set to be slightly less than the diameter of the solder balls 13 mounted. The protective dummy members 24 are mounted on the stage to follow the mounting of solder balls 13. After mounting the protective dummy members 24, the dicing of the semiconductor wafer 21 is conducted. Thereby, the protective dummy members 24 are automatically disposed on the ends of the package.

Although in the above embodiments the chip size package is fabricated by bonding connection, this invention can be also applied to a case that a package is fabricated by using an electrode-extracting means not by bonding connection. Although in this embodiment the protective dummy members of heat-resisting plastic material are mounted just before the dicing, they can be in advance fabricated on one board where package main-body boards are disposed like ball grid array. Also, the protective dummy members can be mounted using methods other the attachment method described above, such as resin molding, formation of thick film by screen printing or the like.

Also, though in the above embodiments the solder balls 13 are provided and then the protective dummy members 12 or 24 are mounted, they may be mounted in the reverse order. Namely, the solder balls 13 may be provided after the protective dummy members 12 or 24 are mounted.

Advantages of the Invention

According to the invention, the protective members with a predetermined length are disposed along at least two sides of the surface where the array of solder balls are provided. The protective members function as a guide to make uniform the offset spacing between the wiring board and the package main-body board when mounting the wiring board on the package main-body board through the solder balls, even when re-flowing the solder balls. Thus, the cost reduction, and the mass production of semiconductor package can be advanced. Furthermore, the mounting space of solder balls can be enlarged.

Further, according to the invention, a plurality of semiconductor chips are mounted on one package main-body board, then mounting the solder balls and protective members in the lump on to the plurality of semiconductor chips. Alternatively, at the stage of a semiconductor wafer, the solder balls and dummy members for each of multiple semiconductor devices are mounted. Thus, the simplification of fabrication process for chip size package or semiconductor device, the cost reduction and the mass production of chip size package or semiconductor device can be advanced.

Also, in the methods of the invention, by disposing the protecting members on the borderline, the protective members can be placed precisely at the ends of the package. Therefore a tolerance against a stress applied to the ends of package after fabrication can be enhanced. Also, since the restriction in the BGA region becomes less than that in prior art, the mounting area for solder balls can be enlarged and therefore the number of pins can be increased.

Furthermore, by setting the thickness of the protective members to be slightly less than the diameter of solder balls, the protective members function as a support between the package and the printed wiring board against a stress applied to the end of chip size package in the vertical direction. Thus, the solder balls can be protected.

Although the invention has been described with respect to specific embodiment for completer and clear disclosure, the appended claims are not to be thus limited but are to be construed as embodying all modification and alternative constructions that may be occurred to one skilled in the art which fairly fall within the basic teaching here is set forth.

What is claimed is:

1. A semiconductor package, comprising:
a chip-sized wiring board having a predetermined wiring pattern;
a semiconductor chip mounted on said wiring board and electrically connected to said wiring pattern;
sealing resin that seals at least the connection part of said wiring board and said semiconductor chip;
an array of solder balls for external electrical circuit connection, each said solder ball being connected through an opening in said sealing resin to a land of said wiring pattern; and
a protective member disposed along approximately an entire length of at least two sides of said array of solder balls.

2. A method for making a semiconductor package, comprising the:
mounting a plurality of semiconductor chips on a board having a plurality of identical wiring patterns;
electrically connecting each of said semiconductor chips to one of said identical wiring patterns of said board;
resin-sealing a surface of said board that incurs said electrical connection;
mounting a plurality of solder balls to form at least one ball grid array, having a plurality of sides, on a surface of said board;
mounting a protective member having a predetermined length on each of a dicing line along at least two sides of each said ball grid array, said protective member for protecting a vertical offset spacing of said ball grid array; and
dicing said board along said dicing lines to longitudinally divide said protective member approximately down a centerline of its longitudinal axis.

3. A method according to claim 2, wherein:
said protective member comprises a heat-resisting plastic film.

4. A method according to claim 2, wherein:
said protective member has a thickness slightly less than the diameter of said solder balls, said thickness being a dimension of the protective member in a direction perpendicular to a surface upon which said protective member is affixed.

5. A method according to claim 2, wherein:
said protective member is adhered to the surface of said board.

6. A method according to claim 2, wherein:
said protective member is mounted essentially around an entire periphery of a chip size package after the dicing is completed.

7. A method for making a semiconductor package on a semiconductor wafer, comprising:
forming ball grid arrays of solder balls on a plurality of areas predetermined to be separated semiconductor chips fabricated on said semiconductor wafer;
affixing protective members having predetermined lengths on the borderlines between each two adjacent said ball grid arrays and on corresponding outer edges of ball grid arrays, so that each ball grid array has a protective member along at least two sides thereof; and
dicing said semiconductor wafer to divide said protective members approximately down a midline of its longitudinal axis in the direction of a dicing line for said protective members mounted on borderlines between two grid arrays.

8. A method according to claim 7, wherein:
each of said protective members comprises a heat-resisting plastic film.

9. A method according to claim 7, wherein:
each of said protective members has a thickness slightly less than the diameter of said solder balls, said thickness being a dimension of the protective member in a direction perpendicular to a surface upon which said protective member is affixed.

10. A method according to claim 7, wherein:
said protective member is adhered to the surface of said board.

11. A semiconductor package, comprising:
an array of solder balls for external circuit connection; and
at least one longitudinal protective member disposed along each of at least two sides of a surface area where said array of solder balls are located, said at least one protective member maintaining a vertical offset spacing for said external circuit electrical connection.

12. A protective member affixed longitudinally to at least one continuous section of a periphery of a ball grid array on a chip size package, said protective member maintaining a vertical offset spacing for an external circuit electrical connection.

13. The protective member of claim 12, further affixed astride a predetermined dicing line for a substrate wafer, said substrate wafer serving as the surface upon which is mounted said ball grid array, such that said protective member is sliced approximately down a midline of its longitudinal axis when the said substrate wafer is diced.

14. A method for making a semiconductor package, comprising:

mounting at least one semiconductor chip on a board;

forming at least one solder ball grid array on said board to an establish external electrical contact;

affixing a longitudinally-shaped protective member astride each of at least two dicing lines adjacent to said at least one ball grid array, said protective member maintaining a vertical offset spacing for said external circuit electrical connection; and dicing said board along said dicing line to longitudinally divide said protective member approximately along a centerline of its longitudinal axis.

* * * * *